US009661786B2

United States Patent
Lu et al.

(10) Patent No.: US 9,661,786 B2
(45) Date of Patent: May 23, 2017

(54) ELECTRONIC DEVICE AND METHOD FOR ASSEMBLING THE SAME

(71) Applicant: Delta Electronics (Shanghai) Co., Ltd., Shanghai (CN)

(72) Inventors: Xing-Xian Lu, Shanghai (CN); Pei-Ai You, Shanghai (CN); Gang Liu, Shanghai (CN); Jin-Fa Zhang, Shanghai (CN)

(73) Assignee: DELTA ELECTRONICS (SHANGHAI) CO., LTD., Shanghai (CN)

( * ) Notice: Subject to any disclaimer, the term of this patent is extended or adjusted under 35 U.S.C. 154(b) by 125 days.

(21) Appl. No.: 14/339,463

(22) Filed: Jul. 24, 2014

(65) Prior Publication Data
US 2015/0146380 A1 May 28, 2015

(30) Foreign Application Priority Data
Nov. 26, 2013 (CN) .......................... 2013 1 0612832

(51) Int. Cl.
*H05K 7/20* (2006.01)
*H05K 7/14* (2006.01)
*H05K 3/32* (2006.01)

(52) U.S. Cl.
CPC ......... *H05K 7/20409* (2013.01); *H05K 3/328* (2013.01); *H05K 7/1432* (2013.01); *H05K 7/209* (2013.01); *H05K 2203/04* (2013.01); *Y02T 90/124* (2013.01); *Y10T 29/49002* (2015.01); *Y10T 29/49144* (2015.01)

(58) Field of Classification Search
None
See application file for complete search history.

(56) References Cited

U.S. PATENT DOCUMENTS

| 5,552,961 A | * | 9/1996 | Van Gaal | ............. | H05K 7/2049 |
| | | | | | 165/104.21 |
| 2009/0244847 A1 | * | 10/2009 | Chen | ................... | H05K 7/2049 |
| | | | | | 361/704 |
| 2013/0235527 A1 | * | 9/2013 | Wagner | ................ | H05K 1/0203 |
| | | | | | 361/702 |

FOREIGN PATENT DOCUMENTS

| CN | 100373600 C | 3/2008 |
| JP | U3-51891 | 5/1991 |
| JP | 2000-299580 A | 10/2000 |
| JP | 2001-160696 A | 6/2001 |

(Continued)

*Primary Examiner* — Courtney Smith
*Assistant Examiner* — Zhengfu Feng
(74) *Attorney, Agent, or Firm* — CKC & Partners Co., Ltd.

(57) ABSTRACT

An electronic device includes a bottom case, an accommodation unit, an electromagnetic induction module, a heat-dissipating component, an elastic clip, a printed wiring board, and an electronic component. The accommodation unit is disposed on the bottom case. At least one portion of the electromagnetic induction module is disposed in the accommodation unit. The heat-dissipating component is disposed on the bottom case and is separated from the accommodation unit. The elastic clip is partially mounted on the heat-dissipating component. The printed wiring board has a first surface and a second surface, and the first surface faces the accommodation unit. The electronic component includes a main body and pin feet. The pin feet are electrically connected to the printed wiring board, and the main body is clamped between the heat-dissipating component and the elastic clip.

9 Claims, 17 Drawing Sheets

(56) References Cited

FOREIGN PATENT DOCUMENTS

| JP | 2001160696 A | * | 6/2001 |
|----|--------------|---|--------|
| JP | 2003-309384 A | | 10/2003 |
| JP | 2013094022 A | | 5/2013 |
| KR | 20110103851 A | | 9/2011 |
| TW | I361972 B | | 4/2012 |

* cited by examiner

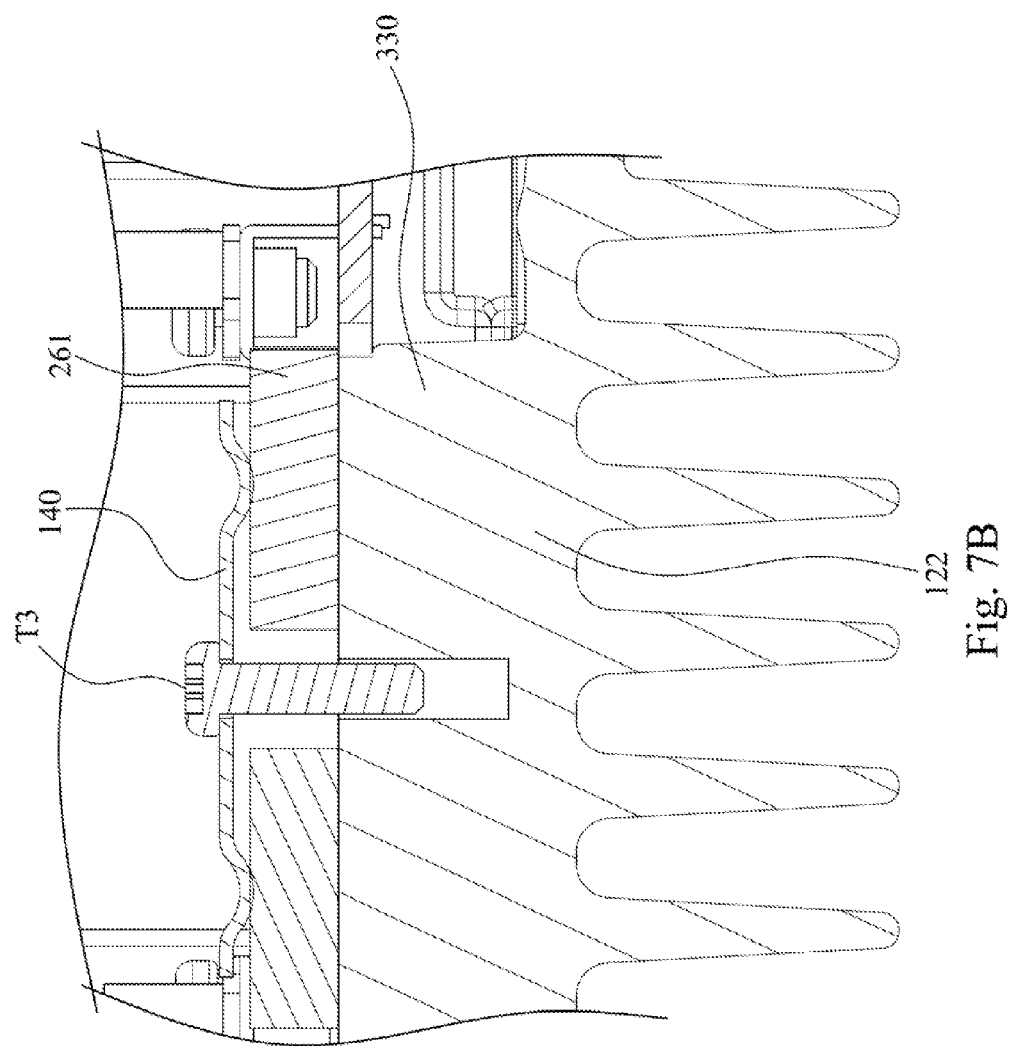

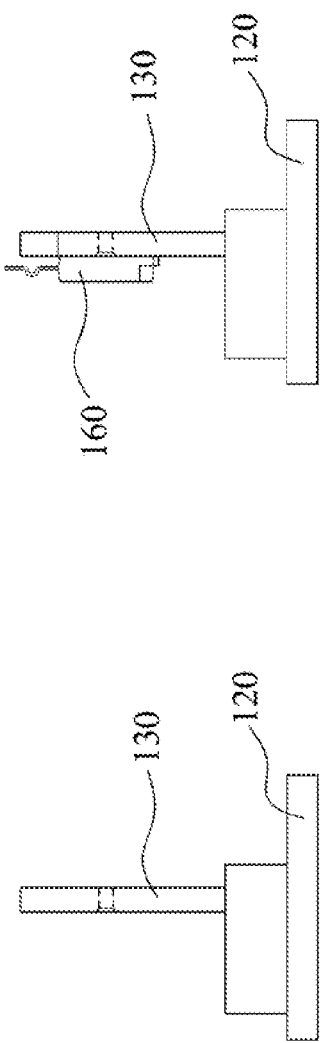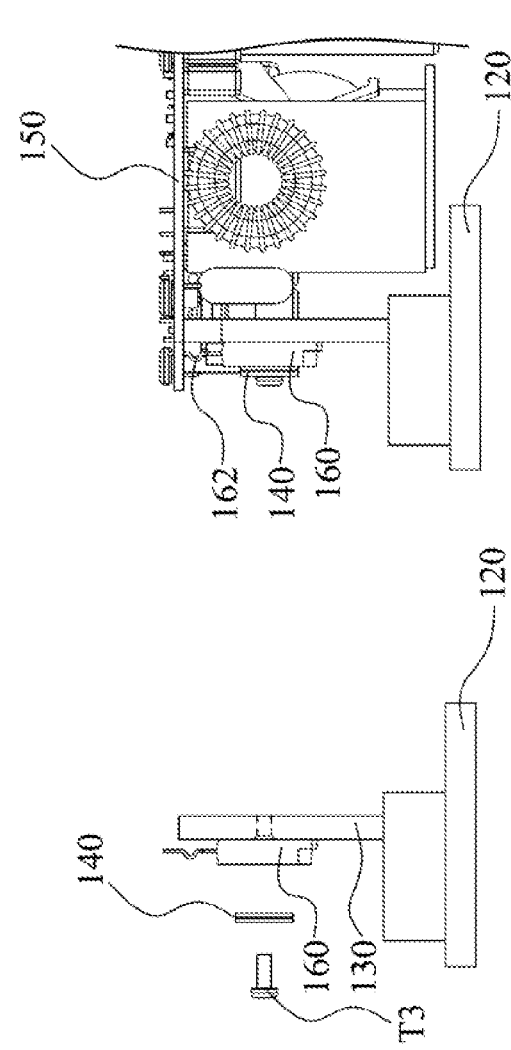

ELECTRONIC DEVICE AND METHOD FOR ASSEMBLING THE SAME

RELATED APPLICATIONS

This application claims priority to Chinese Application Serial Number 201310612832.4, filed Nov. 26, 2013, which is herein incorporated by reference.

BACKGROUND

A hybrid electric vehicle or an electric vehicle has the advantages of economy, energy saving and environmental protection, etc., and has become the main focus of research and development for the major automobile companies under the crisis of energy shortage. With the advance of the automobile industry, vehicle amount has been increasing, and the pressure from the environmental pollution and the energy shortage has become obvious. At present, as the world is running out of fossil fuel, and the situation of global warming is getting urgent, countries around the world regard energy saving and environmental protection as the prior direction of development for the future automobile industry. With their obvious features of high efficiency, energy saving, low noise and null emission, electric vehicles have an incomparable superiority in the aspect of energy saving and environmental protection. In recent years, the electric vehicles have achieved great improvements in the core technologies such as power battery, electrical motor, control system, and on board charger module. The safety, reliability, and lifetime of products are significantly raised, and the manufacturing cost is under a certain level of control. Hybrid electric vehicles and electric vehicles are gradually entering the stage of practical use and small industrialization, and will be the strategic direction of the development of the automobile industry.

As one of the key components of electric vehicle, a charger module can be classified as an off board charger module and an on board charger module (OBCM). The off board charger module, which is also referred to as a ground charging device or a charging pile, often has a larger power, larger volume, and greater mass. The OBCM is a device mounted on an electric vehicle for charging a battery pack by the AC power grid, in which an AC power cable is plugged into a socket of the electric vehicle to get it charged. The OBCM is essentially a power conversion device. The OBCM uses input wires to receive alternative current which is coupled to AC power grid, and outputs high voltage direct current to charge the on board high voltage battery pack, and uses a communication port to maintain real-time interactive communications with a battery management system (BMS). The overall performance enhancement and the cost control of the OBCM are always key factors restricting the mass production of electric vehicles, and the structure design and the thermal management of the OBCM are ones of the most critical indicators for comprehensively evaluating the performance of the OBCM.

However, the OBCM, or the power conversion device, consumes a lot of electricity, the electronic components in the power conversion device generate quite a lot of heat with the increasing of power density of the OBCM or device, and if the electronic components do not physically contact the heat spreaders, the heat-dissipating efficiency is limited and the heat transferring performance is not good.

In view of the foregoing, there still exist inconvenience and defects in the aforementioned conventional hardware configuration, and further improvements need to be made. In order to solve the above problems, those who are in related fields have made a lot of efforts, but suitable solutions have not been developed. Therefore, how to enhance the heat-dissipating efficiency is becoming an important R&D topic, and is a goal that urgently needs to be improved.

SUMMARY

This disclosure provides an electronic device and a method for assembling the same.

In one embodiment, an electronic device is provided. The electronic device includes a bottom case, an accommodation unit, an electromagnetic induction module, a heat-dissipating component, an elastic clip, a printed wiring board, and an electronic component. The accommodation unit is disposed on the bottom case. At least one portion of the electromagnetic induction module is disposed in the accommodation unit. The heat-dissipating component is disposed on the bottom case and is separated from the accommodation unit. The elastic clip is partially mounted on the heat-dissipating component. The printed wiring board has a first surface and a second surface, and the first surface faces the accommodation unit. The electronic component includes a main body and a plurality of pin feet. The pin feet are electrically connected to the printed wiring board, and the main body is clamped between the heat-dissipating component and the elastic clip.

In another embodiment, a method for assembling an electronic device is provided. The method includes enabling a heat-dissipating component to physically contact an electronic component, and fixing an elastic clip to the heat-dissipating component, so as to clamp the electronic component between the heat-dissipating component and the elastic clip.

In another embodiment, a method for assembling an electronic device is provided. The method includes assembling an elastic clip on a heat-dissipating component, thereby forming a clamping space between the elastic clip and the heat-dissipating component, and inserting an electronic component into the clamping space, so as to clamp the electronic component between the heat-dissipating component and the elastic clip.

The electronic device and the method for assembling the electronic device provided by the disclosure may be applied to all electronic devices or to the relevant technical aspects such as vehicle charger modules. Whenever the electronic component is uprightly disposed or is flatly disposed, the heat-dissipating efficiency of the electronic component may be enhanced by the configurations of this invention. Therefore, the failure risk of the electronic component due to the overheating may be reduced, and the life of the electronic component may be increased.

In sum, compared to the prior art, the aforementioned embodiments may have the following advantages:

1. the assembling time becomes shorter;
2. the method for assembling the electronic component becomes more flexible; and
3. the heat-dissipating efficiency of the electronic component is enhanced.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows:

FIG. 7B is a cross-sectional view viewed along line A-A of FIG. 7A;

FIGS. 13A to 13D are sequential operation views of FIG. 12;

DETAILED DESCRIPTION

In the following detailed description, for purposes of explanation, numerous specific details are set forth in order to provide a thorough understanding of the disclosed embodiments. It will be apparent, however, that one or more embodiments may be practiced without these specific details. In other words, these specific details are not essential to practice one or more embodiments. Besides, well-known structures and devices are schematically depicted in order to simplify the drawings.

The terminology used herein is for the purpose of describing particular embodiments only and is not intended to be limiting of the invention. As used herein, the singular forms "a", "an" and "the" are intended to include the plural forms as well, unless the context clearly indicates otherwise.

As used herein, "around", "about" or "approximately" shall generally mean within 20 percent, preferably within 10 percent, and more preferably within 5 percent of a given value or range. Numerical quantities given herein are approximate, meaning that the term "around", "about" or "approximately" can be inferred if not expressly stated.

Figure 1:
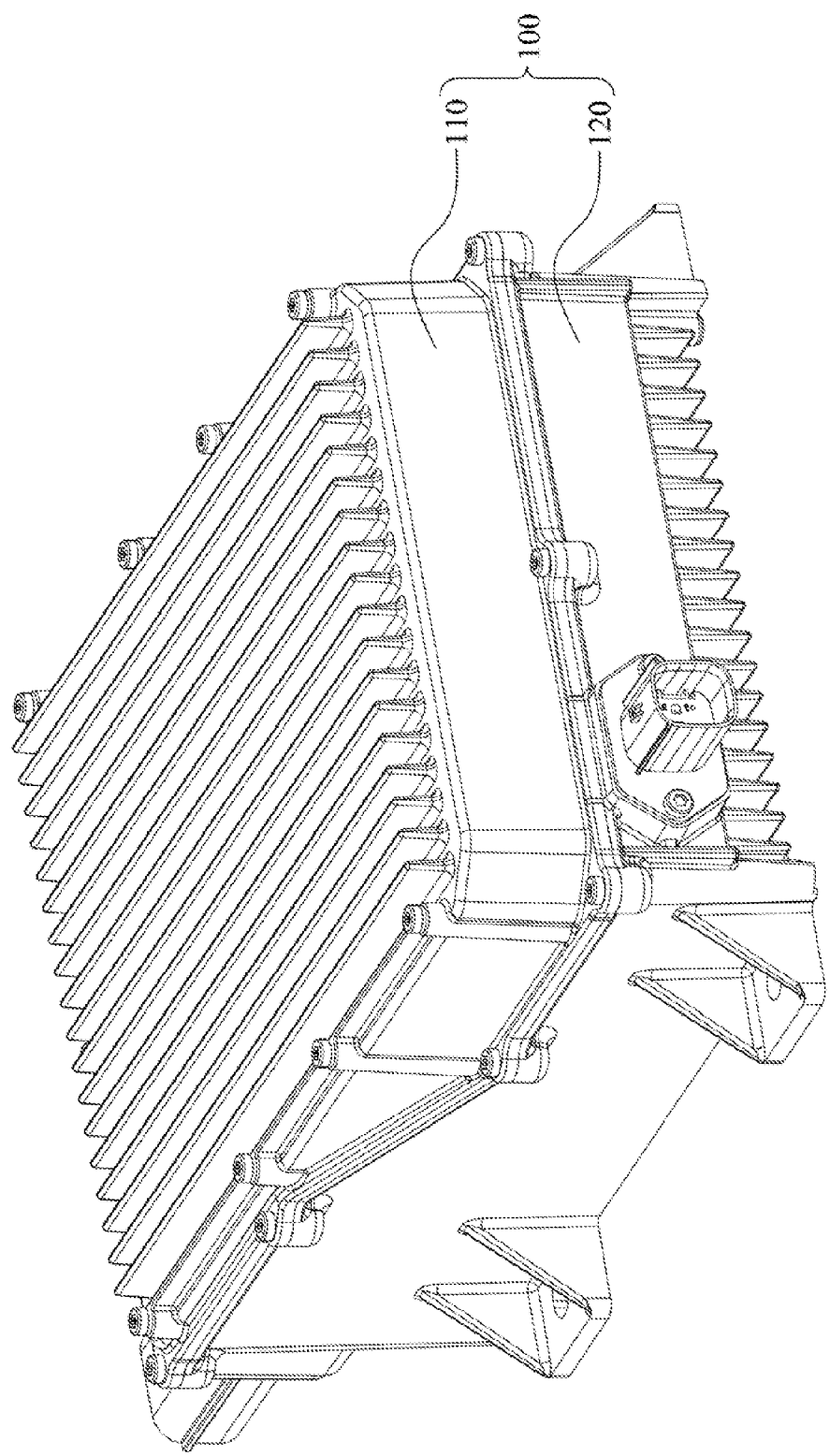
FIG. 1 is an assembled view of an electronic device according to a first embodiment of this invention.
Figure 2:
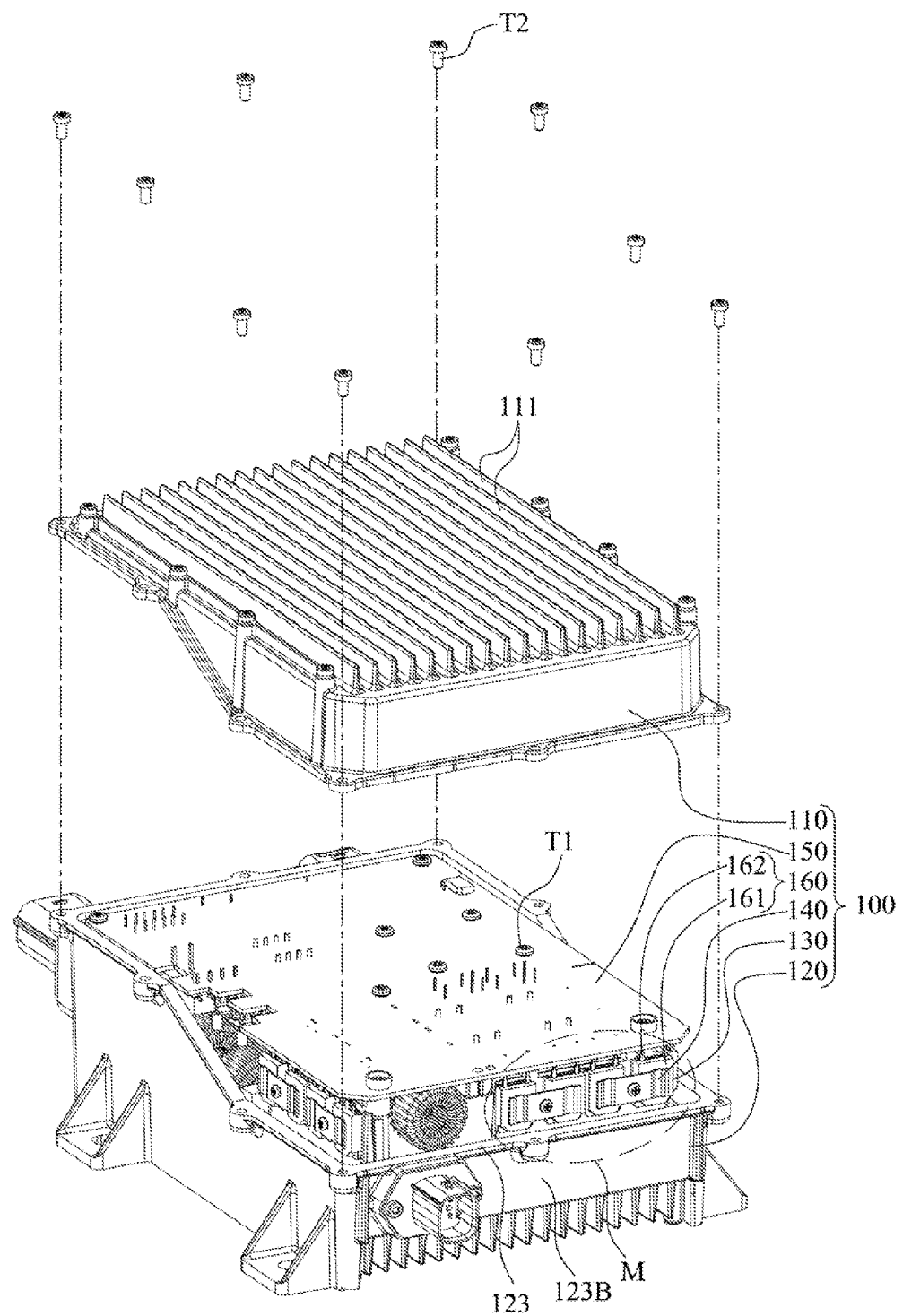
FIG. 2 is a partially exploded view of FIG. 1.

FIG. 1 is an assembled view of an electronic device 100 according to a first embodiment of this invention. FIG. 2 is a partially exploded view of FIG. 1. As shown in FIG. 1 and FIG. 2, an electronic device 100 is provided. The electronic device 100 includes a bottom case 120, a heat-dissipating component 130, an elastic clip 140, a printed wiring board 150, and at least one electronic component 160 such as a transistor. The heat-dissipating component 130 is disposed on the bottom case 120. The elastic clip 140 is partially mounted on the heat-dissipating component 130. Each of the electronic components 160 includes a main body 161 and pin feet 162. The pin feet 162 are electrically connected to the printed wiring board 150, and the main body 161 is clamped between the heat-dissipating component 130 and the elastic clip 140.

In the above deposition configuration, the heat-dissipating component 130 and the electronic component 160 tightly contact each other through the elastic clip 140. Therefore, no matter how the electronic component 160 is disposed, the failure risk of the electronic component 160 due to the overheating may be reduced, and the lifetime of the electronic component 160 may be increased.

Figure 3:
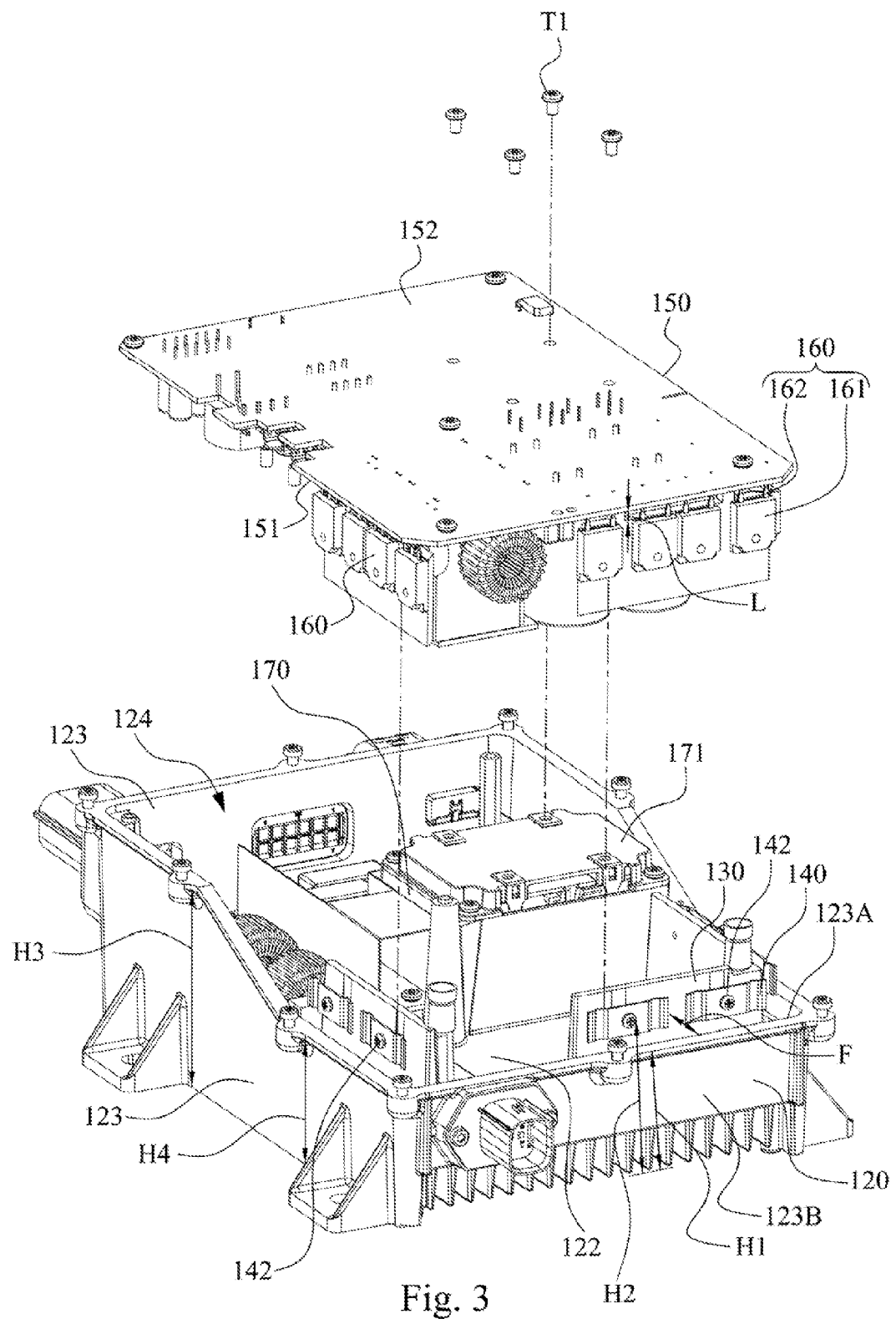
FIG. 3 is an exploded view showing a bottom case and a printed wiring board of FIG. 2.

FIG. 3 is an exploded view showing the bottom case 120 and the printed wiring board 150 of FIG. 2. As shown in FIG. 2 and FIG. 3, the bottom case 120 includes an accommodation unit 170 and an electromagnetic induction module 171. The accommodation unit 170 is disposed on the bottom case 120 and may be separated from the heat-dissipating component 130. At least one portion of the electromagnetic induction module 171 is disposed in the accommodation unit 170, and the other portion of the electromagnetic induction module 171 is disposed outside the accommodation unit 170. In other embodiments, the entire electromagnetic induction module may be disposed in the accommodation unit.

Because the electromagnetic induction module 171 generates a lot of heat when operating, the heat generated by the electromagnetic induction module 171 may be dissipated to the bottom case 120 by the accommodation unit 170. At this time, because the heat-dissipating component 130 is separated from the accommodation unit 170, the heat generated by the electromagnetic module 171 may be prevented from directly transferring to the heat-dissipating component 130, thus maybe avoiding affecting the heat-dissipating efficiency of the heat-dissipating component 130 for the electronic component 160.

As shown in FIG. 2 and FIG. 3, specifically, electronic parts, such as transistors, capacitors, etc are disposed on the printed wiring board 150. The printed wiring board 150 has a first surface 151 and a second surface 152. The printed wiring board 150 is fixed to the portion of the electromagnetic induction module 171 outside the accommodation unit 170 by screws T1, such that the first surface 151 faces the accommodation unit 170 and the bottom case 120. Therefore, the screws not only fix the printed wiring board 150 to the electromagnetic induction module 171 but also electrically couple the printed wiring board 150 to the electromagnetic induction module 171.

In addition, the electronic components 160 are disposed on the printed wiring board. Specifically, the electronic components 160 are uprightly disposed on the first surface 151 of the printed wiring board 150. Because the electronic components 160 are respectively uprightly disposed on the printed wiring board 150 and are respectively tightly clamped between the heat-dissipating component 130 and the elastic clip 140, areas on the printed wiring board 150 occupied by the electronic component 160 may become smaller to reduce the volume of the electronic device 100, and the heat may be effectively dissipated due to a high thermal conductivity of the heat-dissipating component 130. Because the surfaces with the maximum areas at the same side of the electronic components 160 are aligned to each other, the surfaces at the same side of the electronic component 160 contact the heat-dissipating component 130 to provide better heat-dissipating performance. Embodiments of this invention are not limited thereto. In other embodiments, the electronic components may be flatly disposed on the first surface of the printed wiring board, such that the electronic component may be tightly clamped between the heat-dissipating component and the elastic dip easily.

Additionally, each of the main bodies 161 is clamped between the heat-dissipating component 130 and the elastic clip 140 (shown in FIG. 2). Each of the pin feet 162 is disposed between the main body and the printed wiring board 150, and is electrically connected to the printed wiring board 150 and the main body 161. An appropriate distance L is maintained between the main body 161 and the printed wiring board 150, and the main body 161 is spaced from the printed wiring board 150 at the distance L.

Figure 4:
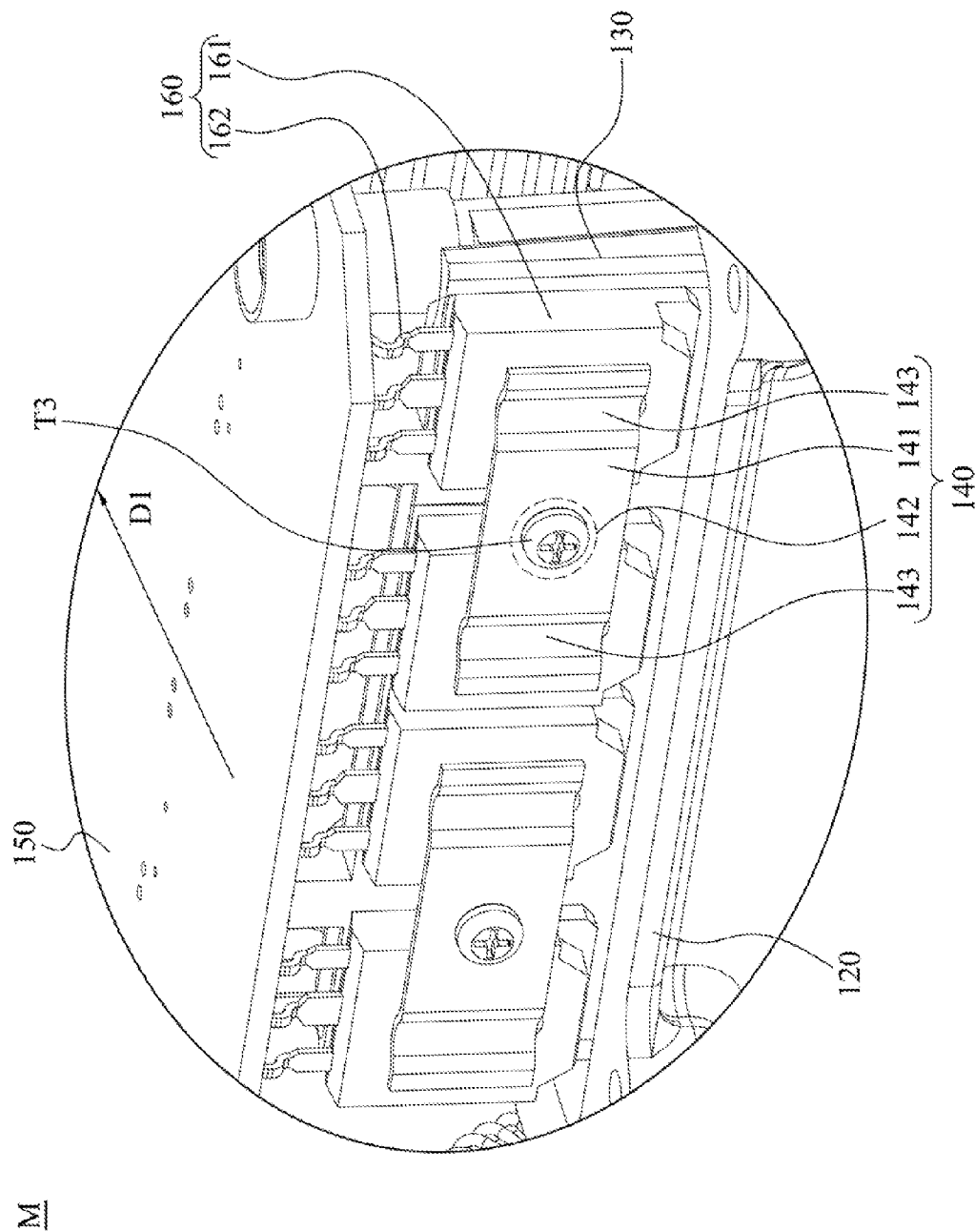
FIG. 4 is a partially enlarged view of an area M of FIG. 2.

FIG. 4 is a partially enlarged view of an area M of FIG. 2. As shown in FIG. 4, in the first embodiment, the elastic clip 140 includes a main body 141, a fixing portion 142 and a pressing portion 143. The fixing portion 142 is located on a portion of the main body 141, and is mounted on the heat-dissipating component 130 by fixing components such as screws T3. The pressing portion 143 is located on another portion of the main body 141 and presses the electronic component 160 to contact the heat-dissipating component 130. For example, the main body 141 may be a stripe, and the elastic clip 140 may include two pressing portions 143. The two pressing portions 143 are disposed on two opposite ends of the main body 141. Each of the two pressing portions 143 is convex. The fixing portion 142 is located between the two pressing portions 143 and is fixed to the heat-dissipating component 130 by the screws T3 disposed in a gap between any two adjacent bodies 161.

Therefore, the fixing portion 142 is fixed to the heat-dissipating component 130 in a direction from the elastic clip 140 to the heat-dissipating component 130 by the screws T3, and the main body 141 of the elastic clip 140 is forced to respectively push the two pressing portions 143 in a direction D1 toward's the heat-dissipating component 130, such that a surface of the main body 161 tightly contacts a surface of the heat-dissipating component 130, thereby maybe generating sufficient contact pressure on a contact surface between the main body 161 and the heat-dissipating component 130, and meanwhile maybe eliminating the gap between the main body 161 and the heat-dissipating 130, thus lowering an interfacial thermal resistance between the main body 161 and the heat-dissipating component 130.

The disclosure does not intend to limit the materials of the heat-dissipating component 130 and the elastic clip 140. However, when the materials of the heat-dissipating component 130 and the elastic clip 140 are conductive materials such as metals, the surfaces of the heat-dissipating component 130 and the elastic clip 140 are covered with thermal conductive isolation layers (not shown in Figures) so as to be electrically isolated from electronic components 160.

As shown in FIG. 3 and FIG. 4, the bottom case 120 is a cold plate base which is hollow, and a fluid passage is disposed in the bottom case 120. By injecting a liquid passing through the fluid passage, the heat-dissipating efficiency may be enhanced. In addition, as shown in FIG. 2, in the embodiment, the electronic device 100 further includes a top cover 110. The top cover 110 covers the bottom case 120, and the top cover 110 is fixed to the bottom case 120 by screws T2, such that all of the aforementioned components are disposed between the top cover 110 and the bottom case 120 and are protected. In order to enhance the heat-dissipating efficiency, the top cover 110 may further have fins 111.

As shown in FIG. 3, the bottom case 120 includes a bottom board 122 and side walls 123. The side walls 123 surround and are connected to the bottom board 122, and extend towards the printed wiring board 150, such that an accommodation space 124 is defined. The accommodation space 124 accommodates the heat-dissipating component 130, the elastic clip 140, the accommodation unit 170, the electromagnetic induction module 171, the printed wiring board 150 and the electronic component 160. The accommodation unit 170 is disposed on the bottom board 122 and between the printed wiring board 150 and the bottom board 122. The printed wiring board 150 is fixed to the electromagnetic induction module 171 by fixing members such as the screws T1. The heat-dissipating component 130 faces an inner surface 123A of one of the side walls 123. In the first embodiment, the heat-dissipating component 130 is monolithically formed with the bottom board 122 of the bottom case 120. An adequate distance F is maintained between the heat-dissipating component 130 and an inner surface 123A of the one of the side walls 123 disposed in the bottom case 120.

People having ordinary skills in the art can make proper modifications to the heat-dissipating component 130 and the bottom case 120 according to their actual applications. In other embodiments, the heat-dissipating component may be dismantably mounted on the bottom board of the bottom case.

In the first embodiment, the elastic clip 140 is closer to the side wall 123 facing the heat-dissipating component 130 than the heat-dissipating component 130 is. An outer surface 123B of the side wall 123 is a portion of the outer surface of the electronic device 100. A height H1 of the side wall 123, i.e., a minimum distance between a top surface of the side wall 123 away from the bottom board 122 and the bottom board 122, is smaller than a height H2, i.e., a minimum distance between the fixing portion 142 and the bottom board 122. In other words, as shown in FIG. 2 and FIG. 3, after the printed wiring board 150 is assembled on the bottom case 120, the side wall 123 of the bottom case 120 is not too high and thus does not block the fixing portion 142 of the elastic clip 140. For example, a height of the side wall 123 on the left side is smaller from the one end of the side wall 123 to the other end of the side wall 123, such that a height H3 of the side wall 123 is reduced to a height H4, and the fixing portion 142 of elastic clip 140 is exposed from a portion of the side wall 123 with a smaller height.

Therefore, in the first embodiment, because the elastic clip 140 is closer to the side wall 123 facing the heat-dissipating component 130 than the heat-dissipating component 130 is, and because the fixing portion 142 of elastic clip 140 is exposed from the portion of the side wall 123 with a smaller height, the elastic clip 140 can be easily fixed to the heat-dissipating component 130 by assembly workers from a position near the portion of the side wall 123 with a smaller height, and the elastic clip 140 may be fixed to the heat-dissipating component 130 after the printed wiring board 150 covers the electromagnetic induction module 171. Therefore, the assembling time becomes shorter, and the assembling process becomes more flexible, and no other additional special fixing tools are needed, thus reducing the assembling time and cost.

Figure 5B:
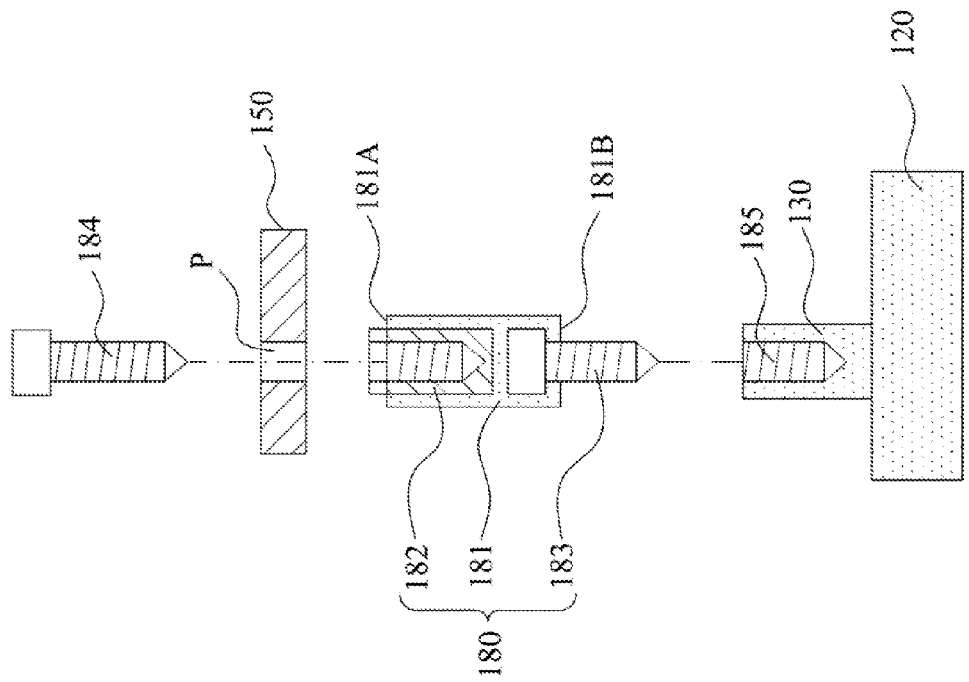
FIG. 5B is an exploded cross-sectional view of the printed wiring board, the insulated strut, and a heat-dissipating component according to the second embodiment of this invention.
Figure 5A:
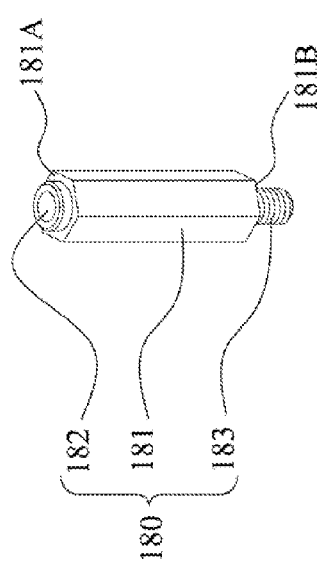
FIG. 5A is a 3-D view of an insulated strut according to a second embodiment of this invention.

FIG. 5A is a 3-D view of an insulated strut 180 according to a second embodiment of this invention. FIG. 5B is an exploded cross-sectional view of the printed wiring board 150, the insulated strut 180, and the heat-dissipating component 130 according to the second embodiment of this invention. The insulated strut 180 may be applied in the first embodiment. As shown in FIG. 5B, in order to fix and electrically insulate the printed wiring board 150 and the bottom case 120, at least one insulated strut 180 is disposed between the wiring 150 and the bottom case 120. The insulated strut 180 is connected to the heat-dissipating component 130 and the printed wiring board 150, and the insulated strut 180 physically fixes and electrically insulates the heat-dissipating component 130 from the printed wiring board 150.

Specifically, the insulated strut 180 includes a first connecting part 182, a second connecting part 183, and a plastic part 181 partially covering the first connecting part 182 and the second connecting part 183. The first connecting part 182 may be connected to the printed wiring board 150, and the first connecting part 182 may be a nut. The second connecting part 183 may be connected to the bottom case 120, and the second connecting part 183 may be a stud. Therefore, the printed wiring board 150 and the bottom base 120 may be fixed through the insulated strut 180. The plastic part 181 includes a first end surface 181A and a second end surface 181B opposite to the first end surface 181A. The first connecting part 182 is embedded in the first end surface 181A. A portion of the second connecting part 183 is disposed in the plastic part 181, and the other portion of the second connecting part protrudes from the second end surface 181B.

More specifically, the first connecting part 182 may be a nut, and the second connecting part 183 may be a stud. The second connecting part 183 is fixed to the bottom case 120, and the printed wiring board 150 is fixed to the first connecting part 182 through a screw 184. The first connecting part 182 may be a blind-hole nut. The main body of the nut is substantially disposed in the plastic part 181, and only an upper surface of the nut is disposed outside the plastic part 181 to expose a screw hole P in the nut. The second connecting part 183 is a stud, a head of the stud is disposed in the plastic part 181, and a threaded portion of the stud is disposed outside the plastic part 181 to correspond to a screw hole 185 on the bottom case 120.

In order to effectively electrically insulate the printed wiring board 150 from bottom case 120, the first connecting part 182 and the second connecting part 183 are separated by the plastic part 181. Though the first connecting part 182 and the second connecting part 183 are both metals, the plastic part 181 is disposed between the first connecting part 182 and the second connecting part 183, such that the first connecting part 182 may not directly contact the second connecting part 183 and an adequate safety distance is maintained.

Figure 6A:
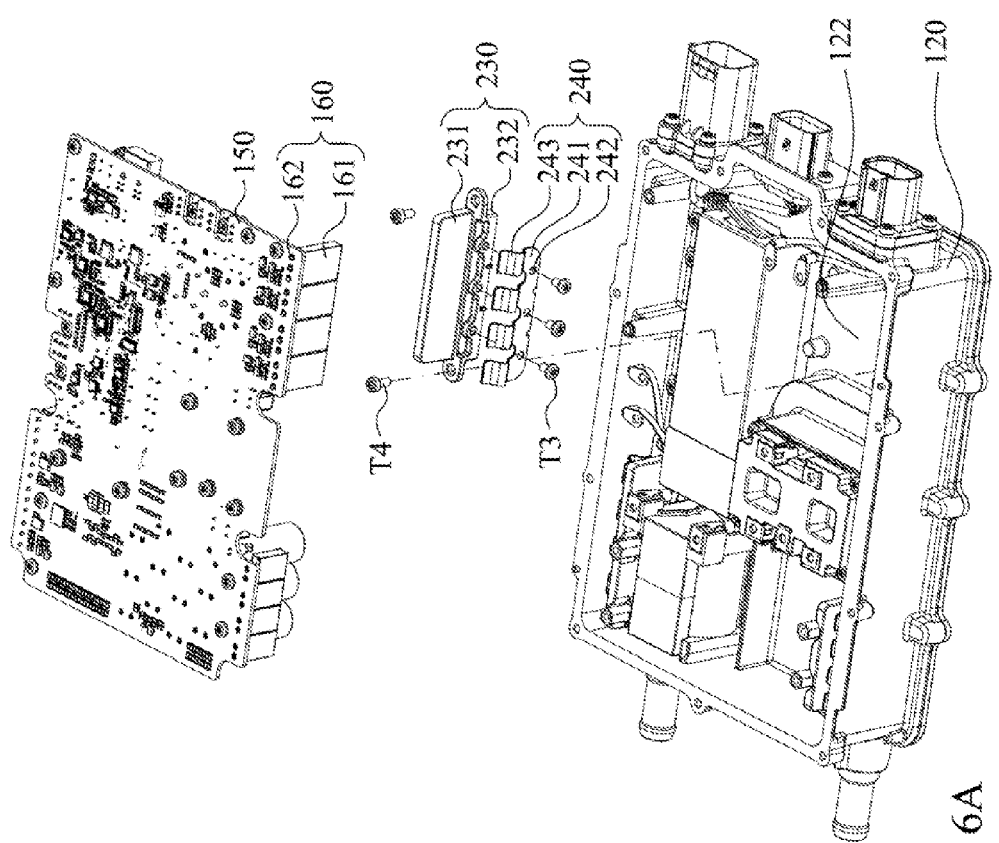
FIG. 6A is an exploded view of a electronic device according to a third embodiment of this invention.
Figure 6B:
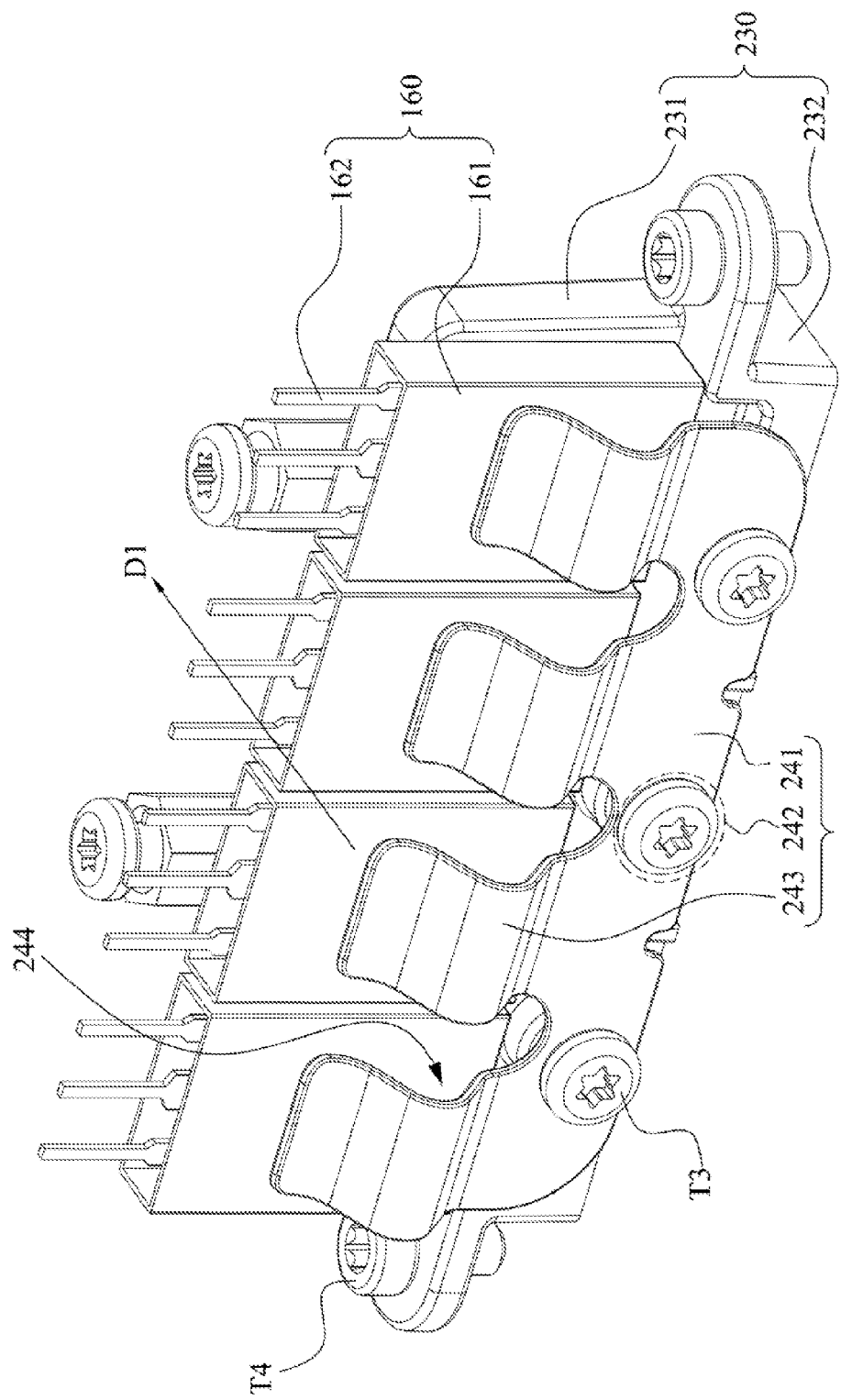
FIG. 6B is an assembled view of a elastic clip and a heat-dissipating component according to the third embodiment of this invention.

FIG. 6A is an exploded view of an electronic device 101 according to a third embodiment of this invention. FIG. 6B is an assembled view of the elastic clip 240 and the heat-dissipating component 230 according to the third embodiment of this invention. As shown in FIG. 6A, the electronic device 101 of the third embodiment is similar to the electronic device 100 of the first embodiment, and the only difference is that the appearances of the elastic clip 240 and the heat-dissipating component 230 of the third embodiment are different from the appearances of the elastic clip 140 and the heat-dissipating component 130 of the first embodiment. Specifically, the heat-dissipating component 230 is an independent object, and the heat-dissipating component 230 is dismantably mounted on the bottom case 120. The heat-dissipating component 230 includes a heat-dissipating block 231 and a base 232. The heat-dissipating block 231 partially contacts the electronic component 160. The base 232 is connected to the bottom case 120. For example, the base 232 is a strip. One side of the base 232 is connected to the heat-dissipating block 231, and two opposite ends of the base 232 are fixed to the bottom case 120 through screws T4. Though there is no printed wiring board in FIG. 6B, it only means that the electronic component 160 is not mounted on the bottom case 120 yet, and it does not mean that the electronic component 160 does not need to be mounted on the printed wiring board. The heat-dissipating component 230 may be assembled on the bottom case 120 before or after contacting the electronic component 160.

Therefore, the deposition position of heat-dissipating component 230 may be adjusted according to the deposition position of the electronic component 160. Then, as long as the heat-dissipating component 230 is fixed to the bottom case 120, the heat-dissipating component 230 provides the electronic component 160 with an appropriate heat-dissipating path.

Additionally, as shown in FIG. 6A and FIG. 6B, in the third embodiment, the elastic clip 240 includes a main body 241, a fixing portion 242 and a pressing portion 243. For example, the main body 241 is a stripe. Three fixing portions 242 are disposed on the main body 241 at intervals, and the fixing portions 242 is fixed to the base 232 through the screws T3, such that a clamping space 244 allowing the main body 161 to inserted therein is formed between the elastic clip 240 and the heat-dissipating block 231. The three pressing portions 243 all extend outwardly from one side of the main body 241. The number of the pressing portions 243 is the same as the number of the bodies 161, and the pressing portions 243 are respectively corresponding to the bodies 161. Each of the pressing portions 243 is hook-shaped, and one end of each of the pressing portions 243 presses the corresponding main body 161 towards the direction D1.

By designing each of the pressing portions 243 bending towards the heat-dissipating block 231, each of the pressing portion 243 are forced to press the main body 161 towards the heat-dissipating block 231, such that one surface of the main body 161 tightly contact one surface of the heat-dissipating block 231. Therefore, adequate contact pressure on the contact surface of the main body 161 and the heat-dissipating block 231 is generated, and a gap between the main body 161 and the heat-dissipating block 231 is eliminated, such that an interfacial thermal resistance between the main body 161 and the heat-dissipating block 231 is lowered.

The disclosure does not intend to limit the materials of the heat-dissipating component 230 and the elastic clip 240. However, when the materials of the heat-dissipating component 230 and the elastic clip 240 are conductive materials such as metals, an isolation layer with a high thermal conductivity (not shown in Figures) covers surfaces of the heat-dissipating component 230 and the elastic chip 240 to electrically isolate electronic components 260.

Figure 7A:
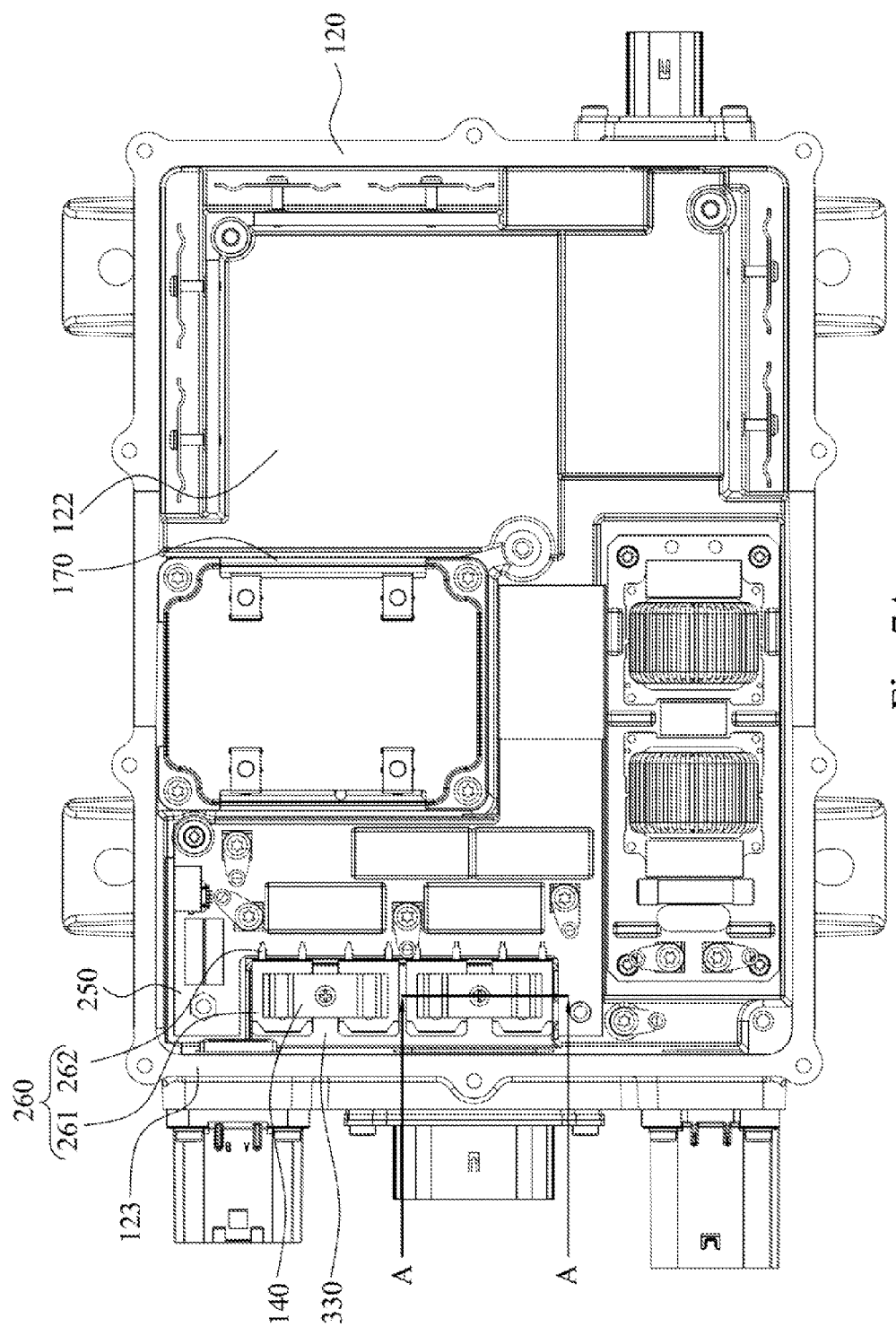
FIG. 7A is a top view of a bottom case according to a fourth embodiment of this invention.

FIG. 7A is a top view of the bottom case 120 according to a fourth embodiment of this invention. FIG. 7B is a cross-sectional view viewed along line A-A of FIG. 7A. As shown in FIG. 7A, the difference between the first embodiment and the fourth embodiment is that the printed wiring board 250 is disposed on the bottom board 122 of the bottom case 120, the printed wiring board 250 and the accommodation unit 170 are disposed side by side, and the printed wiring board 250 is not disposed on the electromagnetic induction module 171. The electronic components 260 are flatly disposed on the printed wiring board 250. Specifically, the electronic components 260 such as transistors are flatly disposed on one surface away from the bottom board 122 of the printed wiring board 250. Embodiments of this invention are not limited thereto. In other embodiments, the electronic component is uprightly disposed on a surface away from the bottom case of the printed wiring board, such that the electronic component may be easy to be tightly clamped between the heat-dissipating component and the elastic clip.

In addition, each of the electronic components 260 includes a main body 261 and pin feet 262. One end of each of the pin feet 262 is electrically connected to the printed wiring board 250, and the other end of each of the pin feet 262 supports the main body 261 after bending. As shown in FIG. 7B, each of the bodies 261 is clamped between the heat-dissipating component 330 and the elastic clip 140.

The disclosure does not intend to limit the materials of the heat-dissipating component 330 and the elastic clip 140. However, when the materials of the heat-dissipating component 330 and the elastic clip 140 are conductive materials such as metals, an isolation layer with a high thermal conductivity (not shown in Figures) covers surfaces of the heat-dissipating component 330 and the elastic clip 140 to electrically isolate electronic components 260.

Additionally, as shown in FIG. 7A and FIG. 7B, a side surface of the heat-dissipating component 330 is connected to one of the side walls 123 of the bottom case 120, and the heat-dissipating component 330 is monolithically formed with the bottom board 122. The elastic clip 140 is mounted on the heat-dissipating component 330 through the fixing component such as the screws T3. Therefore, the heat-dissipating component 330 dissipates heat to the bottom case 120 through two paths, and the heat-dissipating efficiency of the heat-dissipating component 330 is enhanced.

People having ordinary skill in the art can make proper modification to the heat-dissipating component 330 and the bottom case 120 according to their actual applications. In other embodiments, the heat-dissipating component may be dismantably mounted on the bottom case.

Figure 8:
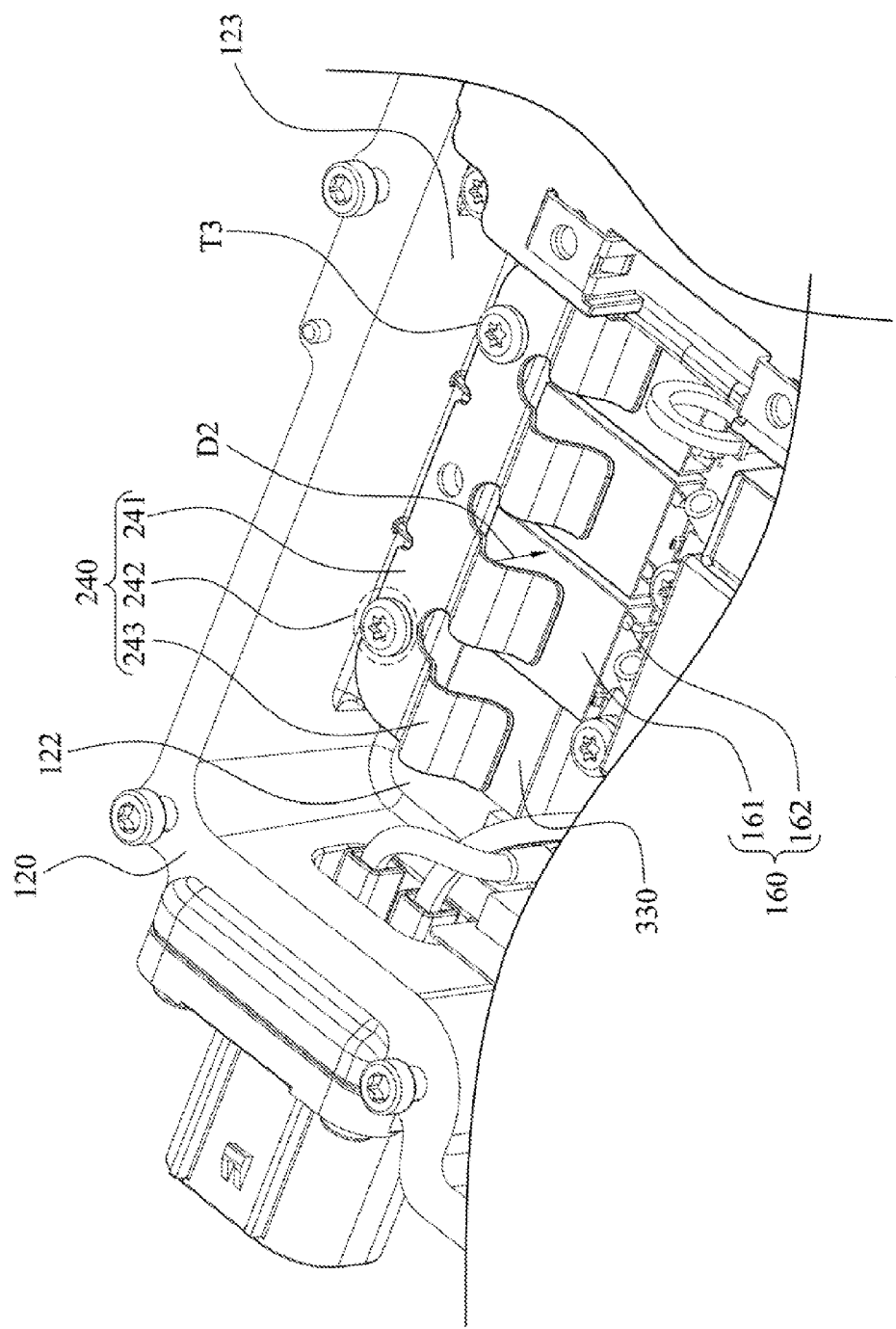
FIG. 8 is a top view of a bottom case according to a fifth embodiment of this invention.

FIG. 8 is a top view of the bottom case 120 according to a fifth embodiment of this invention. As shown in FIG. 8, the difference between the fourth embodiment and the fifth embodiments is that the form of the elastic clip 240 of the fifth embodiment is different from the elastic clip 140 of FIG. 7A.

As shown in FIG. 8, the heat-dissipating component 330 is a heat-dissipating block monolithically formed with the bottom board 122 of the bottom case 120. For clearly illustrating the connection relation between the heat-dissipation component 330 and the bottom board 122 of the bottom case 120, one electronic component 160 corresponding to the leftmost pressing portion 243 is omitted. The number of electronic components 160 shown in FIG. 8 is three, which does not mean the actual number of the electronic component 160 of the fifth embodiment. The elastic clip 240 includes a main body 241, two fixing portions 242, and pressing portions 243. The main body 241 is a strip. The two fixing portions 242 are disposed on the main body 241 at intervals, and the fixing portions 242 are fixed to the heat-dissipating component 330 through the screws T3. The pressing portions 243 all extend outwardly from one side of the main body 241. A number of the pressing portions 243 is the same as a number of the bodies 161, and the pressing portions 243 respectively correspond to the bodies 161. Each of the pressing portions 243 is hook-shaped, and one end of each of the pressing portion 243 presses the corresponding main body 161.

By designing each of the pressing portions 243 bending towards the heat-dissipating component 330, each of the pressing portion 243 presses the main body 161 towards the heat-dissipating component 330, such that one surface of the main body 161 tightly contact one surface of the heat-dissipating component 330. Therefore, a contact surface between the main body 161 and the heat-dissipating component 330 is increased, and a gap between the main body 161 and the heat-dissipating component 330 is eliminated. Because each of the surfaces with the maximum areas of the electronic components 160 are aligned to each other, the surfaces at the same side of the electronic components 160 contact the heat-dissipating component 330, and a better heat-dissipating efficiency is provided.

Figure 9:
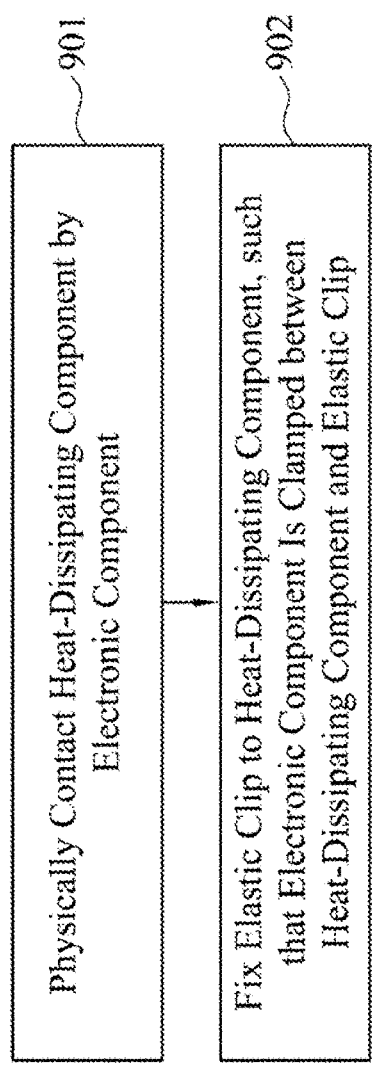
FIG. 9 is a flowchart of a method for assembling an electronic device according to a sixth embodiment of this invention.

FIG. 9 is a flowchart of a method for assembling the electronic device according to a sixth embodiment of this invention. As shown in FIG. 3 and FIG. 9, a method for assembling an electronic device is provided. The method includes the following steps. Step 901 is enabling the heat-dissipating component 130 to physically contact the electronic component 160. Then, step 902 is fixing the elastic clip 140 to the heat-dissipating component 130, so as to clamp the electronic component 160 between the heat-dissipating component 130 and the elastic clip 140. Before or after welding the electronic component 160 on the printed wiring board 150, the electronic component 160 is fixed to the heat-dissipating component 130 through the elastic clip 140, such that two opposite sides of the electronic component 160 respectively tightly contact the elastic clip 140 and the heat-dissipating component 130. Therefore, the assembling time may become shorter, and the assembling process for the electronic component 160 may become more flexible.

Though the heat-dissipating component 130 is monolithically formed with the bottom case 120 (shown in FIG. 3) in the method, embodiments of this invention are not limited thereto. In other embodiments, such as the embodiment shown in FIG. 6A and FIG. 6B, if the aforementioned heat-dissipating component 230 is independent from the bottom case 120, a step of assembling the heat-dissipating component 230 to the bottom case 120 is performed before the step 901 or after the step 902.

Figure 10:
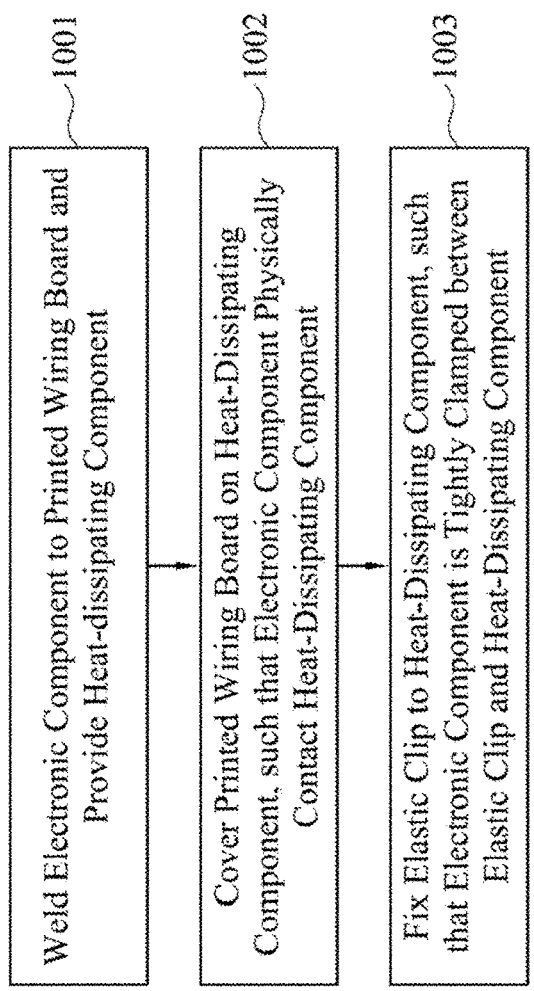
FIG. 10 is a flowchart of the method for assembling the electronic device in one sequence according to the sixth embodiment of this invention.
Figure 11D:
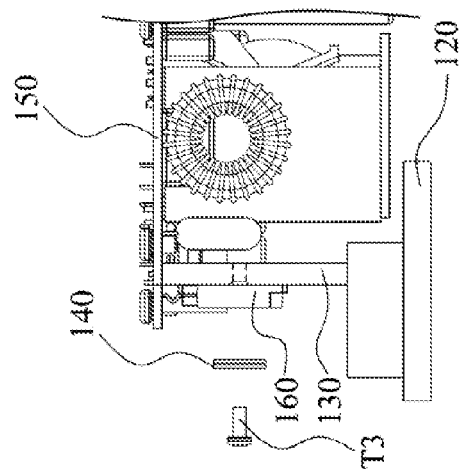
FIGS. 11A to 11D are sequential operation views of FIG. 10.
Figure 11C:
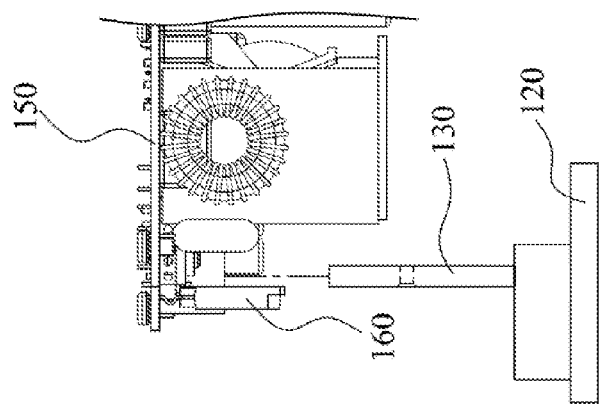

FIG. 10 is a flowchart of the method for assembling the electronic device 100 in one sequence according to the sixth embodiment of this invention. FIGS. 11A to 11O are sequential operation views of FIG. 10. As shown in FIG. 10 and FIGS. 11A to 11O, the sequence of steps of the sixth embodiment is according to the first embodiment, and the method for assembling the electronic device 100 includes the following steps.

The step 1001 is welding the electronic component 160 on the printed wiring board 150 and providing the aforementioned heat-dissipating component 130. The step 1002 is covering the heat-dissipating component 130 with the printed wiring board 150, such that the electronic component 160 physically contacts the heat-dissipating component 130. The step 1003 is fixing the elastic clip 140 to the heat-dissipating component 130, so as to tightly clamp the electronic component 160 between the elastic clip 140 and the heat-dissipating component 130.

Figure 11B:
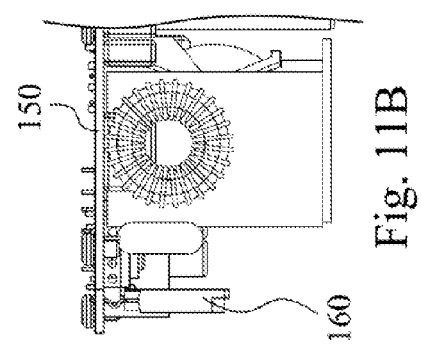
Figure 11A:
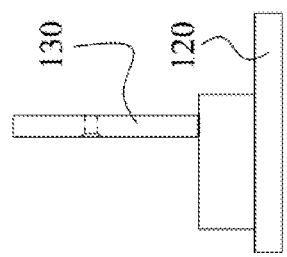

Specifically, in the step 1001, the heat-dissipating component 130 is monolithically formed with the bottom case 120 (shown in FIG. 11A), and the aforementioned electronic component 160 such as the transistor is welded on the printed wiring board 150 before the printed wiring board 150 covers the heat-dissipating component 130 (shown in FIG. 11B). In the embodiment, the electronic component 160 of FIG. 11B is uprightly welded on the printed wiring board 150. However, the electronic component 160 may be flatly disposed on the printed wiring board 150. In the step 1002, the printed wiring board 150 welded with the electronic component 160 of FIG. 11C is covered on the heat-dissipating component 130, such that a surface of the heat-dissipating component 130 contacts a common mounting surface of the electronic components 160. In the step 1003, the elastic clip 140 of FIG. 11D physically contacts a surface away from the heat-dissipating component 130 of the electronic component 160, and the elastic clip 140 presses the electronic component 160 towards the heat-dissipating component 130 hard and fixes the electronic component 160 to the heat-dissipating component 130.

As described in the first embodiment, if the heat-dissipating component 130 and the electronic components 160 are disposed on a portion of the bottom board 122 of the bottom case 120 near the portion of the side wall with the smaller height (shown in FIG. 2), and if the fixing portion 142 of the elastic clip 140 may be exposed by the side wall 123, the position in which the elastic clip 140 is fixed to the heat-dissipating component 130 (that is, fixing portion) is not blocked by the side wall 123 of the bottom case 120 (shown in FIG. 2), and assembly workers may easily fix the elastic clip 140 to the heat-dissipating component 130 from outside. Therefore, no additional special fixing tools are needed, and the assembling time and cost are reduced.

Though in the sequence, the heat-dissipating component 130 is monolithically formed with the bottom case 120 (shown in FIG. 11A), embodiments of this invention are not limited thereto. In other embodiments, such as the embodiment shown in FIG. 6A and FIG. 6B, if the aforementioned heat-dissipating component 230 is independent from the bottom case 120, a step of assembling the heat-dissipating component 230 to the bottom case 120 may be performed before the step 1002 or after the step 1003.

Figure 12:
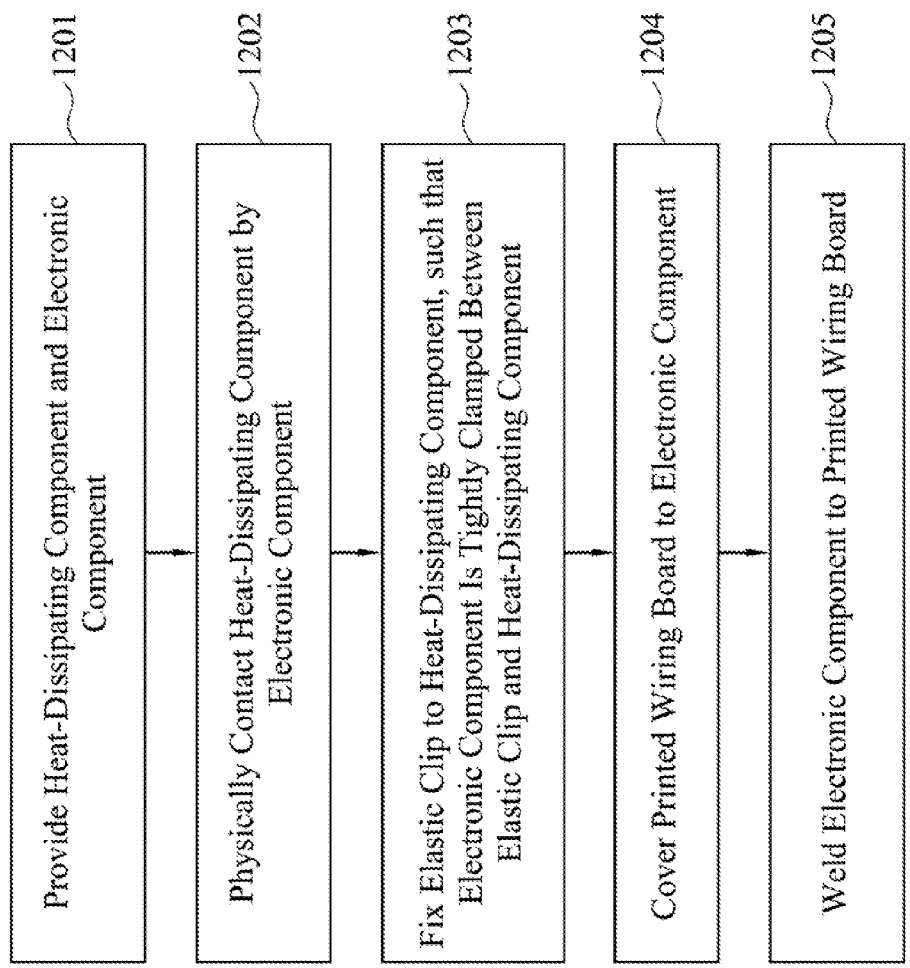
FIG. 12 is a flowchart of the method for assembling the electronic device in another sequence according to the sixth embodiment of this invention.

FIG. 12 is a flowchart of the method for assembling the electronic device 100 in another sequence according to the sixth embodiment of this invention. FIGS. 13A to 13O are sequential operation views of FIG. 12. As shown in FIG. 12 and FIGS. 13A to 13O, the sequence of the sixth embodiment is according to the first embodiment, and the method for assembling the electronic device 100 includes the following steps. Step 1201 is providing the aforementioned heat-dissipating component 130 and the aforementioned electronic component 160. Step 1202 is enabling the heat-dissipating component 130 physically contact the electronic component 160. Step 1203 is fixing the elastic clip 140 to the heat-dissipating component 130, so as to tightly clamp the electronic component 160 between the elastic clip 140 and the heat-dissipating component 130. Step 1204 is covering the electronic component 160 with the printed wiring board 150. Step 1205 is welding the electronic component 160 on the printed wiring board 150.

Specifically, in the step 1201, the heat-dissipating component 130 is monolithically formed with the bottom case 120 (shown in FIG. 13A), and the aforementioned electronic component 160 is still not mounted on the printed wiring board 150 (shown in FIG. 13B). In the step 1202, the electronic component 160 without welding contacts a surface of the heat-dissipating component 130 of FIG. 13G. In the step 1203, the elastic clip 140 contacts a surface away from the heat-dissipating component 130 (shown in FIG. 13C) of the electronic component 160, and the elastic clip 140 presses the electronic component 160 towards the heat-dissipating component 130 hard and fixes the electronic component 160 to the heat-dissipating component 130. In the step 1204, the printed wiring board 150 is covered on the electronic component 160 (shown in FIG. 13D), such that pin feet 162 of the electronic component 160 are inserted in the printed wiring board 150, so as to perform the welding process in the step 1205.

The electronic component 160 is supported only by the pin feet 162. By welding the electronic component 160 to the printed wiring board 150 after the heat-dissipating component 130 and the elastic clip 140 are assembled to the electronic component 160, the entire structure of the electronic component 160 is strengthened, and the risk that the pin feet 162 are deformed due to the inhomogeneous pressure may be reduced.

Though in the sequence, the heat-dissipating component 130 is monolithically formed with the bottom case 120 (shown in FIG. 11A), however, embodiments of this invention are not limited thereto. In other embodiments, such as the embodiment shown in FIG. 6A and FIG. 6B, if the aforementioned heat-dissipating component 230 is independent from the bottom case 120, a step of assembling the heat-dissipating component 230 to the bottom case 120 is performed' before the step 1202 or after the step 1203.

Figure 14:
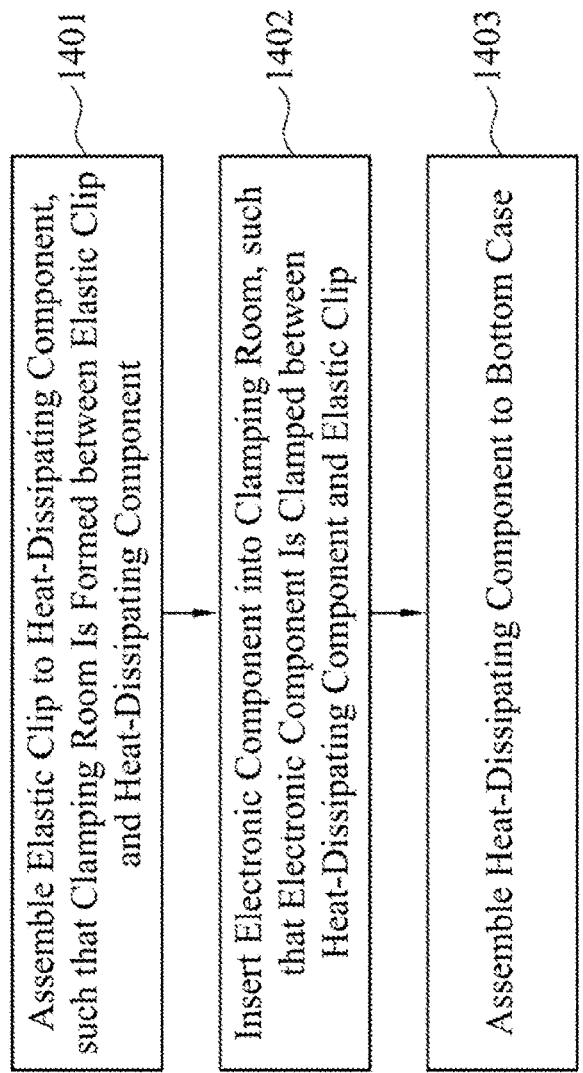
FIG. 14 is a flowchart of a method for assembling an electronic device according to a seventh embodiment of this invention.
Figure 15C:
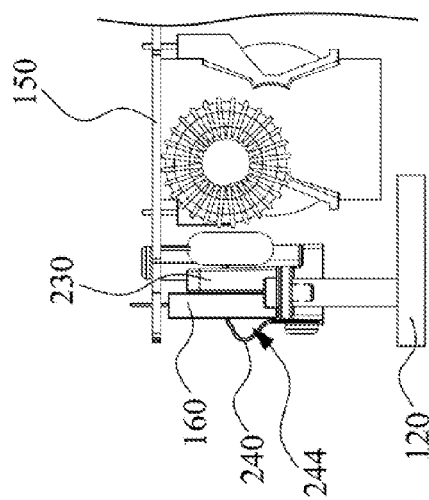
FIGS. 15A to 15C are sequential operation views of FIG. 14.
Figure 15B:
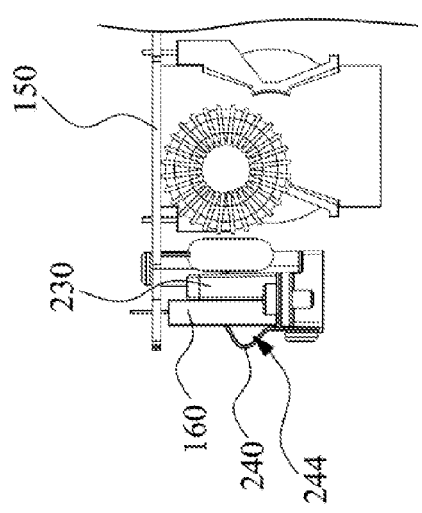
Figure 15A:
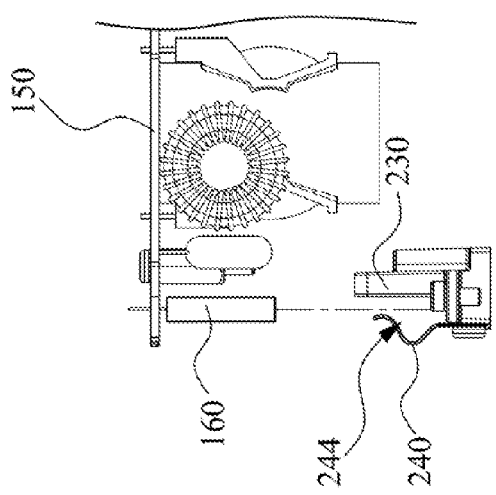

FIG. 14 is a flowchart of a method for assembling the electronic device 101 according to a seventh embodiment of this invention. FIGS. 15A to 15C are sequential operation views of FIG. 14. As shown in FIG. 14 and FIGS. 15A to 15C, the seventh embodiment is according to the third embodiment, and the method for assembling the electronic device 101 includes the following steps.

Step 1401 is assembling the elastic clip 240 on the heat-dissipating component 230, thereby forming a clamping space 244 between the elastic clip 240 and the heat-dissipating component 230 (shown in FIG. 15A). Then, step 1402 is inserting the electronic component 60 into the clamping space 244, so as to clamp the electronic component 160 between the heat-dissipating component 230 and the elastic clip 240 (shown in FIG. 15B). Then, the step 1403 is assembling the heat-dissipating component 230 on the bottom case 120 (shown in FIG. 15C). Therefore, after or before the electronic component 160 is welded to the printed wiring board 150, by inserting the electronic component 160 into the clamping space 244 between the elastic clip 240 and the heat-dissipating component 230, the assembling time may become shorter, and the assembling process for the electronic component 160 may become more flexible.

Specifically, in step 1401, the elastic clip 240 and the heat-dissipating component 230 of FIG. 15A are moved towards the electronic component 160, such that the electronic component is inserted in the clamping space 244 and that the electronic component 160 is clamped between the heat-dissipating component 230 and the elastic clip 240. In step 1403, the step of assembling the heat-dissipating component 230 of FIG. 15C on the bottom case 120 is performed after the elastic clip 240 is assembled to the heat-dissipating component 230 (shown in FIG. 15A).

As shown in FIG. 15A, before step 1402, the method includes welding the electronic component 160 on the printed wiring board 150. The step of welding the electronic component 160 to the printed wiring board 150 may be performed before or after the elastic clip 240 is assembled to the heat-dissipating component 230.

The seventh embodiment is not limited to the aforementioned description. The step of assembling the heat-dissipating component 230 to the bottom case 120 described in step 1403 may be performed before step 1401.

Though the heat-dissipating component 230 is dismantably mounted on the bottom case 120 in the method, embodiments of this invention are not limited thereto. As shown in FIG. 3, if the heat-dissipating component 130 is monolithically formed with the bottom case 120, step 1403, that is, assembling the heat-dissipating component to the bottom case, need not to be performed.

All the features disclosed in this specification (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

Any element in a claim that does not explicitly state "means for" performing a specified function, or "step for" performing a specific function, is not to be interpreted as a "means" or "step" clause as specified in 35 U.S.C. §112, 6th paragraph. In particular, the use of "step of" in the claims herein is not intended to invoke the provisions of 35 U.S.C. §112, 6th paragraph.

What is claimed is:

1. An electronic device, comprising:
    a bottom case comprising a bottom board and a plurality of side walls connected to and surrounding the bottom board;
    an accommodation unit disposed on the bottom case;
    an electromagnetic induction module, wherein at least one portion of the electromagnetic induction module is disposed in the accommodation unit;
    a heat-dissipating component which is disposed on the bottom case and separated from the accommodation unit, and the heat-dissipating component facing an inner surface of one of the side walls;
    an elastic clip comprising a main body; a fixing portion disposed on the main body and mounted on the heat-dissipating component; and a pressing portion disposed on the main body;
    a printed wiring board having a first surface and a second surface, wherein the first surface faces the accommodation unit; and
    an electronic component comprising a main body and a plurality of pin feet, wherein the pin feet are electrically connected to the printed wiring board, and the main body of the electronic component is clamped between the heat-dissipating component and the pressing portion of the elastic clip, wherein a first minimum straight distance between the bottom board and a top surface of the one of the side walls located away from the bottom board is smaller than a second minimum straight distance between the bottom board and the fixing portion, and a third minimum straight distance between the elastic clip and the one of the side walls facing the heat-dissipating component is smaller than a fourth minimum straight distance between the heat-dissipating component and the one of the side walls facing the heat-dissipating component.

2. The electronic device of claim 1, wherein the electronic component is uprightly disposed on the first surface of the printed wiring board.

3. The electronic device of claim 1, wherein the electronic component is flatly disposed on the first surface of the printed wiring board.

4. The electronic device of claim 1, wherein the heat-dissipating component comprises:
    a heat-dissipating block contacting the electronic component; and
    a base which is connected to the heat-dissipating block and mounted on the bottom case.

5. The electronic device of claim 1, wherein the heat-dissipating component is dismantably mounted on the bottom case.

6. The electronic device of claim 1, wherein the heat-dissipating component is monolithically formed with the bottom case.

7. The electronic device of claim 1,
    wherein the pressing portion presses the electronic component to contact the heat-dissipating component.

8. The electronic device of claim 7,
    wherein the bottom board connected to the accommodation unit, and the accommodation unit is disposed between the printed wiring board and the bottom board.

9. The electronic device of claim 1, wherein the side was and the bottom board define an accommodation space, and the heat-dissipating component, the printed wiring board, and the accommodation unit are disposed in the accommodation space.

\* \* \* \* \*